United States Patent
Seong et al.

(10) Patent No.: US 7,193,249 B2
(45) Date of Patent: Mar. 20, 2007

(54) NITRIDE-BASED LIGHT EMITTING DEVICE AND METHOD OF MANUFACTURING THE SAME

(75) Inventors: Tae-yeon Seong, Gwangju-si (KR); June-o Song, Gwangju-si (KR); Dong-seok Leem, Gwangju-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/963,725

(22) Filed: Oct. 14, 2004

(65) Prior Publication Data

US 2005/0082557 A1    Apr. 21, 2005

(30) Foreign Application Priority Data

Oct. 16, 2003  (KR) .............. 10-2003-0072056

(51) Int. Cl.
  H01L 29/24  (2006.01)
(52) U.S. Cl. .............. 257/102; 257/96; 257/745; 438/608; 438/609
(58) Field of Classification Search .......... 257/96, 257/101, 102, 99, 745; 438/45, 608, 609
See application file for complete search history.

(56) References Cited

U.S. PATENT DOCUMENTS 6,638,846 B2* 10/2003 Iwata et al. .......... 438/608
7,132,691 B1* 11/2006 Tanabe et al. .......... 257/79
2003/0122147 A1* 7/2003 Sheu .................. 257/103
2004/0235212 A1* 11/2004 Ishizaki ................ 438/46
2004/0248335 A1* 12/2004 Eliashevich ............ 438/47
2005/0224812 A1* 10/2005 Liu et al. .............. 257/79
2005/0279990 A1* 12/2005 Liu et al. .............. 257/13

FOREIGN PATENT DOCUMENTS

JP        09-129919      5/1997
JP        11-220168      8/1999
JP        2002-164570 A  6/2002

OTHER PUBLICATIONS

Korean Office Action dated Sep. 30, 2005.

* cited by examiner

*Primary Examiner*—Sara Crane
(74) *Attorney, Agent, or Firm*—Buchanan Ingersoll & Rooney PC

(57) ABSTRACT

Provided are a nitride-based light emitting device using a p-type conductive transparent thin film electrode layer and a method of manufacturing the same. The nitride-based light emitting device includes a substrate, and an n-cladding layer, an active layer, a p-cladding layer and an ohmic contact layer sequentially formed on the substrate. The ohmic contact layer is made from a p-type conductive transparent oxide thin film. The nitride-based light emitting device and method of manufacturing the same provide excellent I-V characteristics by improving characteristics of an ohmic contact to a p-cladding layer while enhancing light emission efficiency of the device due to high light transmittance exhibited by a transparent electrode.

33 Claims, 3 Drawing Sheets

NITRIDE-BASED LIGHT EMITTING DEVICE AND METHOD OF MANUFACTURING THE SAME

BACKGROUND OF THE INVENTION

This application claims the priority of Korean Patent Application No. 2003-72056, filed on Oct. 16, 2003, in the Korean Intellectual Property Office, the disclosure of which is incorporated herein in its entirety by reference.

1. Field of the Invention

The present invention relates to a nitride-based light emitting device and a method of manufacturing the same, and more particularly, to a nitride-based light emitting device using a p-type conductive transparent oxide thin film electrode layer and a method of manufacturing the same.

2. Description of the Related Art

The formation of an ohmic contact between a semiconductor and an electrode is of considerable importance in realizing light emitting devices such as light emitting diodes (LEDs) and laser diodes (LDs) that utilize a nitride-based compound semiconductor such as gallium nitride (GaN).

GaN-based light emitting devices are classified as top-emitting LEDs (TLEDs) and flip-chip LEDs (FCLEDs). In commonly used TLEDs, light exits through an ohmic contact layer in contact with a p-cladding layer. TLEDs need a good ohmic contact layer due to low hole concentration in the p-cladding layer. That is, TLEDs require a transparent low resistance ohmic contact layer that can provide optimal current injection to compensate for low electrical conductivity in the p-cladding layer.

TLEDs typically use a structure in which a Ni/Au ohmic contact layer is formed on a p-cladding layer. The Ni/Au layer acts as a semi-transparent ohmic contact layer having excellent specific contact resistivity of $10^{-4}$ to $10^{-3}$ $\Omega cm^2$. Annealing of the Ni/Au layer at temperature of 500 to 600° C. in an oxygen ($O_2$) ambient leads to formation of a nickel oxide (NiO) at the interface between the p-GaN cladding layer and the Ni layer, thereby decreasing a Schottky barrier height (SBH). Thus, holes that are majority carriers can be easily injected into the surface of the p-cladding layer, thus increasing effective carrier concentration near the surface of the p-cladding layer.

Furthermore, annealing of Ni/Au on the p-cladding layer results in disassociation of a Mg—H complex in GaN, which reactivates Mg dopants by increasing the concentration on the surface of GaN. As a result of reactivation, effective carrier concentration increases above $10^{18}$ on the surface of the p-cladding layer, which causes tunneling conductance between the p-cladding layer and the ohmic contact layer containing NiO thus obtaining ohmic conductance characteristics.

However, since TLEDs using Ni/Au semi-transparent film electrode contains Au that reduce light transmittance, they suffer the limitation of realizing next generation light emitting devices with large capacity and high brightness due to their low light utilization efficiency. In a FCLED design, light is extracted through a sapphire substrate using a reflective layer in order to provide sufficient extraction of heat generated during operation while increasing light emission efficiency. However, the FCLED also suffers from problems such as high resistance due to poor adhesion and oxidation of a reflective layer.

Thus, as a solution to overcome the limitation of TLEDs and FCLEDs, the use of indium tin oxide (ITO) has been proposed. ITO is a transparent conductive oxide having superior light transmittance over a semi-transparent Ni/Au used as the conventional p-ohmic contact layer. However, while increasing the output power of a light emitting device, an ITO ohmic contact layer features a high operating voltage due to a high resistance ohmic contact between p-GaN and ITO, which generates much heat. As an alternative approach, Japanese Laid-open Patent Application No. 2002-164570 discloses that high output power was obtained using p-GaN as a transparent electrode layer. However, since the above-cited invention obtains p-ZnO by codoping Ga and N, it causes many problems to actually use the p-ZnO as a transparent electrode for a p-GaN-based light emitting device. Furthermore, since it is known that the p-ZnO suffers from many reliability problems, its use as an electrode for a p-GaN light emitting device results in degradation in device reliability.

SUMMARY OF THE INVENTION

The present invention provides a nitride-based light emitting device with a p-type conductive transparent oxide thin film electrode structure designed to offer low specific contact resistivity and high light transmittance and a method of manufacturing the same.

According to an aspect of the present invention, there is provided a nitride-based light emitting device including an active layer between an n-cladding layer and a p-cladding layer. The light emitting device includes an ohmic contact layer formed on the p-cladding layer using $In_2O_3$ containing a p-type dopant. The p-type dopant includes at least one element selected from a second dopant group consisting of Cu, Ag, Au, Zn, Cd, and Hg. The amount of the p-type dopant added to $In_2O_3$ may be in the range of 0.001 to 40 weight percent.

In another embodiment, the present invention provides a nitride-based light emitting device including an active layer between an n-cladding layer and a p-cladding layer, the device including an ohmic contact layer formed on the p-cladding layer using oxide containing a p-type dopant. The oxide is a first binary oxide containing an element selected among elements in group 2A including Be, Mg, Ca, Sr, Ba, and Ra, a second binary oxide containing an element selected from elements in group 2B including Zn, Cd, and Hg, a first ternary oxide containing an element selected from the elements in group 2A and an element selected from the elements in group 2B, or a second ternary oxide containing an element selected from elements in group 6B including S, Se, Te, and Po and one selected from the elements in group 2B. The p-type dopant includes at least one element selected from a first dopant group consisting of Li, Na, K, Rb, Cs, Cu, Ag, Au, V, Nb, Ta, N, P, As, Sb, and Bi.

The oxide is a compound selected from the group consisting of BeO, CaO, SrO, BaO, MgO, CdO, ZnO, $Mg_{1-x}Zn_xO$, $Be_{1-x}Zn_xO$, $Zn_{1-x}Ba_xO$, $Zn_{1-x}Ca_xO$, $Zn_{1-x}Cd_{Zn1-x}Se_xO$, $Zn_{1-x}S_xO$, and $Zn_{1-x}Te_xO$. The ohmic contact layer is made of one of $Mg_{1-x}Zn_xO$ and $Be_{1-x}Zn_xO$, and the first dopant group further includes As. The amount of the p-type dopant added to the oxide may be in the range of 0.001 to 40 weight percent.

The ohmic contact layer is formed to a thickness of 1 to 1,000 nm. A substrate is formed under the n-cladding layer using sapphire, SiC, Si, or GaAs.

The light emitting device further includes a reflective layer formed on the ohmic contact layer using at least one element selected from the group consisting of Ag, Al, Zn, Mg, Ru, Ti, Rh, Cr, and Pt. The reflective layer may be formed to a thickness of 100 to 2,000 nm.

The light emitting device can further include a capping layer formed on the reflective layer using at least one selected from the group consisting of Ni, Pt, Pd, Zn, and TiN. It may further include an insertion layer formed between the p-cladding layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La. The insertion layer is formed to a thickness of 1 to 5 nm.

According to another aspect of the present invention, there is provided a method of manufacturing a nitride-based light emitting device including an active layer between an n-cladding layer and a p-cladding layer. The method includes the steps of (a) forming an ohmic contact layer of an oxide containing a p-type dopant on the p-cladding layer in a structure on which the n-cladding layer, the active layer, and the p-cladding layer have been formed sequentially on a substrate and (b) annealing the resultant structure obtained by the forming of the ohmic contact layer. The oxide is a first binary oxide containing an element selected among elements in group 2A including Be, Mg, Ca, Sr, Ba, and Ra, a second binary oxide containing an element selected from elements in group 2B including Zn, Cd, and Hg, a first ternary oxide containing an element selected from the elements in group 2A and an element selected from the elements in group 2B, or a second ternary oxide containing an element selected from elements in group 6B including S, Se, Te, and Po and one selected from the elements in group 2B. The p-type dopant includes at least one element selected from a first dopant group consisting of Li, Na, K, Rb, Cs, Cu, Ag, Au, V, Nb, Ta, N, P, As, Sb, and Bi.

In another embodiment, the present invention provides a method of manufacturing a nitride-based light emitting device including an active layer between an n-cladding layer and a p-cladding layer. The method includes the steps of (a) forming an ohmic contact layer of $In_2O_3$ containing a p-type dopant on the p-cladding layer in a structure on which the n-cladding layer, the active layer, and the p-cladding layer have been formed sequentially on a substrate and (b) annealing the resultant structure obtained by the forming of the ohmic contact layer. The p-type dopant includes at least one element selected from a second dopant group consisting of Cu, Ag, Au, Zn, Cd, and Hg.

The active layer has an InGaN/GaN multiquantum well (MQW) or AlGaN/GaN MOW structure. The ohmic contact layer is deposited using an electron-beam evaporator, sputtering deposition, or pulsed laser deposition (PLD). The ohmic contact layer is deposited at temperature of 20 to 1,500° C. under pressure within a reactor in an evaporator of atmospheric pressure to $10^{-12}$ Torr.

Before forming the ohmic contact layer, the method further includes the step of forming an insertion layer between the p-cladding layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

The method further includes the step of forming a reflective layer on the ohmic contact layer using at least one element selected from the group consisting of Ag, Al, Zn, Mg, Ru, Ti, Rh, Cr, and Pt. The method can further include the step of forming a capping layer on the reflective layer using at least one selected from the group consisting of Ni, Pt, Pd, Zn, and TiN.

The annealing may be performed at temperature of 100 to 800° C. for 10 seconds to 3 hours in atmosphere of at least one of $N_2$, Ar, He, $O_2$, $H_2$, or air.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
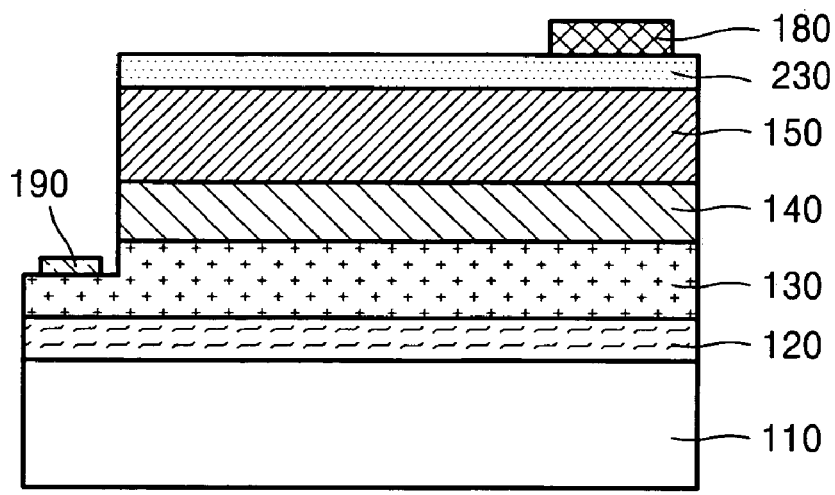
FIG. 1 is a cross-sectional view of a light emitting device with a p-electrode structure according to a first embodiment of the present invention.

Like reference numerals in the drawings denote like elements.

Referring to FIG. 1, a light emitting device with a p-electrode structure according to a first embodiment of the present invention includes a substrate 110, and a buffer layer 120, an n-cladding layer 130, an active layer 140, a p-cladding layer 150 and an ohmic contact layer 230 sequentially formed on the substrate 110. The light emitting device further includes a p-electrode pad 180 and an n-electrode pad 190.

The substrate 110 may be formed from one of sapphire, silicon carbide (SiC), Si, and GaAs. The buffer layer 120 may not be formed. Each of the layers from the buffer layer 120 up to the p-cladding layer 150 is basically made from a compound selected among III-nitride-based compounds represented by the general formula $Al_xIn_yGa_zN$ ($0 \leq x \leq 1$, $0 \leq y \leq 1$, $0 \leq z \leq 1$, $0 \leq x+y+z \leq 1$), and the n p-cladding layers 130 and 150 contain appropriate dopants in addition to the compounds. The active layer 140 may be formed as a single layer or a multiquantum well (MQW) layer or in other various ways known in the art.

For example, when each layer is basically made from a GaN compound, the buffer layer 120 is made of GaN, the n-cladding layer 130 contains an n-type dopant such as Si, Ge, Se, or Te in addition to GaN, the active layer 140 has an InGaN/GaN MQW or AlGaN/GaN MQW structure, and the p-cladding layer 150 contains a p-type dopant such as Mg, Zn, Ca, Sr, or Ba in addition to GaN.

An n-ohmic contact layer (not shown) may be interposed between the n-cladding layer 130 and the n-electrode pad 190 and have a Ti/Al structure or other various known compositions. The p-electrode pad 180 may have a Ni/Au or Ag/Au structure.

Each layer may be formed using an electron-beam evaporator, physical vapor deposition (PVD), chemical vapor deposition (CVD), pulsed laser deposition (PLD), a dual-type thermal evaporator, or sputtering.

The ohmic contact layer 230 is used as a p-electrode structure and made of a p-type transparent oxide film containing a p-type dopant in addition to oxide.

The oxide contained in the ohmic contact layer 230 may be a first binary oxide containing one selected from elements in group 2A on the periodic table. Here, the elements in group 2A include Be, Mg, Ca, Sr, Ba, and Ra.

As an alternative to the first binary oxide, the oxide may be a second binary oxide containing one selected from elements in group 2B on the periodic table. Here, the elements in group 2B include Zn, Cd, and Hg.

Alternatively, the oxide may be a first ternary oxide containing one selected from the elements in group 2A and one selected from the elements in group 2B. Instead of that, a second ternary oxide containing an element selected from elements in group 6B and one selected from the elements in group 2B may be used. The elements in group 6B include S, Se, Te, and Po.

Examples of the oxide include BeO, CaO, SrO, BaO, MgO, CdO, ZnO, $Mg_{1-x}Zn_xO$, $Be_{1-x}Zn_xO$, $Zn_{1-x}Ba_xO$, $Zn_{1-x}Ca_xO$, $Zn_{1-x}Cd_xO$, $Zn_{1-x}Se_{Zn1-x}Te_xO$.

The p-type dopant contained in the ohmic contact layer 230 includes at least one selected from a first dopant group consisting of elements in groups 1A, 1B, 5A, and 5B on the periodic table. That is, the p-type dopant may include Li, Na, K, Rb, Cs, Cu, Ag, Au, V, Nb, Ta, N, P, As, Sb, or Bi.

When ZnO are used as the oxide in the ohmic contact layer 230, As may not be used as the p-type dopant. When $In_2O_3$ is used as the oxide in the ohmic contact layer 230, a p-type dopant corresponding to $In_2O_3$ includes at least one selected from a second dopant group consisting of elements in groups 1B and 2B such as Cu, Ag, Au, Zn, Cd, and Hg.

P-type carriers injected into the ohmic contact layer 230 at a constant rate (hole concentration of $10^{15} \sim 10^{20}/cm^3$, hole mobility of 0.01 to 50) increases effective p-type carrier concentration on the surface of the p-cladding layer 150, which causes tunneling conductance, thereby achieving a high quality ohmic contact.

When the ohmic contact layer 230 is made of a p-type conductive transparent oxide, the amount of p-type dopant added is in the range of 0.001 to 40 weight percent (weight %). Here, weight % refers to the percent of weight of each element contained in the compound.

The thickness of the ohmic contact layer 30 may range from 0.1 to 1,000 nm. The ohmic contact layer 230 may be deposited using an e-beam evaporator, a thermal evaporator, sputtering deposition, or PLD.

Furthermore, the deposition temperature ranges from 20 to 1,500° C. and the pressure within an evaporator ranges from atmospheric pressure to about $10^{-12}$ Torr. The ohmic contact layer 30 may be annealed after deposition. Annealing is performed in a reactor at temperature of 100 to 800° C. in vacuum or gas ambient for 10 seconds to 3 hours. At least one of $N_2$, Ar, He, $O_2$, $H_2$, and air may be injected into the reactor during annealing.

Figure 2:
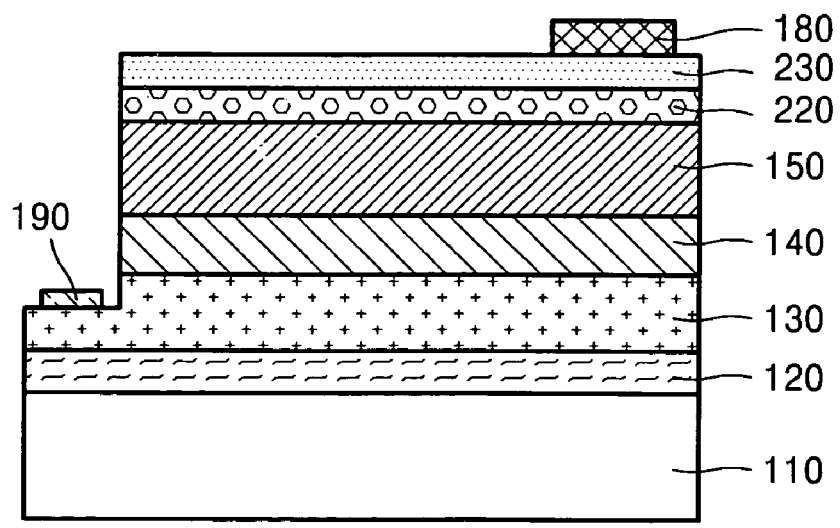
FIG. 2 is a cross-sectional view of a light emitting device with a p-electrode structure according to a second embodiment of the present invention.

FIG. 2 is a cross-sectional view of a light emitting device with a p-electrode structure according to a second embodiment of the present invention. Referring to FIG. 2, the light emitting device includes an insertion layer 220 between an ohmic contact layer 230 and a p-cladding layer 150. That is, the p-electrode structure includes the insertion layer 220 and the ohmic contact layer 230. The insertion layer 220 can be made of a material that helps to form another transparent conductive oxide during annealing after deposition as well as gallide that is a gallium-based compound in order to increase effective carrier (hole) concentration on the surface of the p-cladding layer 150.

To satisfy the requirements, the insertion layer 220 is made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

Since the insertion layer 220 helps not only to adjust the carrier concentration in the ohmic contact layer 230 and the p-cladding layer 150, but also to form another transparent conductive oxide and gallide, it may be more advantageous in forming an excellent ohmic contact to the p-cladding layer 150. The insertion layer 220 may be formed to a thickness of 1 to 5 nm.

Figure 3:
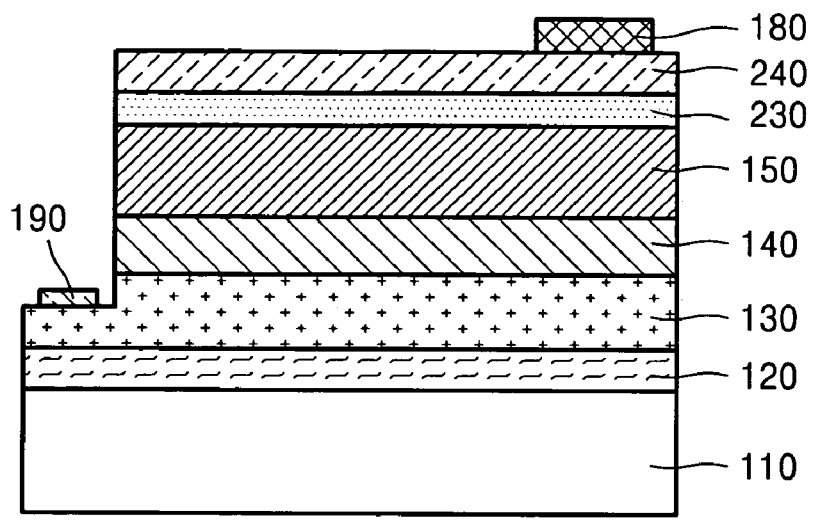
FIG. 3 is a cross-sectional view of a light emitting device with a p-electrode structure according to a third embodiment of the present invention.

FIG. 3 is a cross-sectional view of a light emitting device with a p-electrode structure according to a third embodiment of the present invention. Referring to FIG. 3, the light emitting device includes a reflective layer 240 overlying an ohmic contact layer 230. That is, the p-electrode structure includes the ohmic contact layer 230 and the reflective layer 240. The reflective layer 240 is used for realization of a flip-chip light emitting device and may contain at least one metal selected from the group consisting of Ag, Al, Zn, Mg, Ru, Ti, Rh, Cr, and Pt. The reflective layer 240 may be formed to a thickness of 100 to 2,000 nm.

Figure 4:
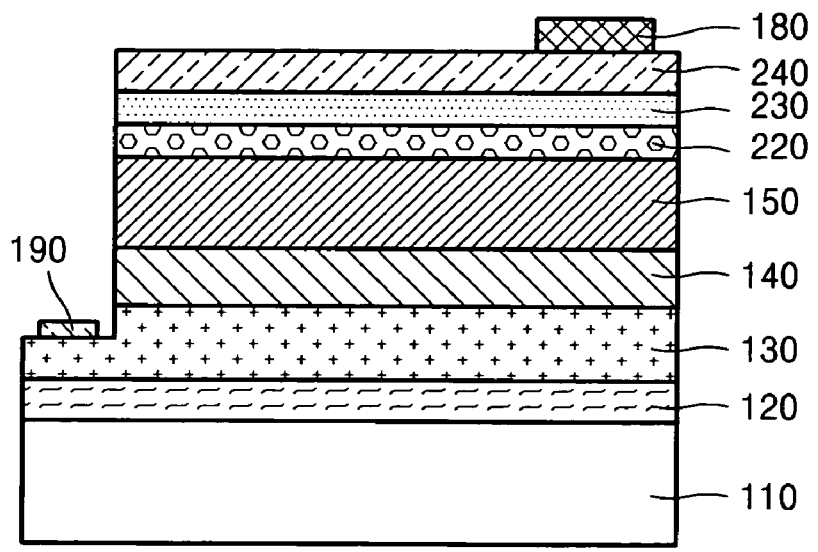
FIG. 4 is a cross-sectional view of a light emitting device with a p-electrode structure according to a fourth embodiment of the present invention.

FIG. 4 shows an example of a light emitting device including the reflective layer 240 in addition to the light emitting device structure of FIG. 2.

Figure 5:
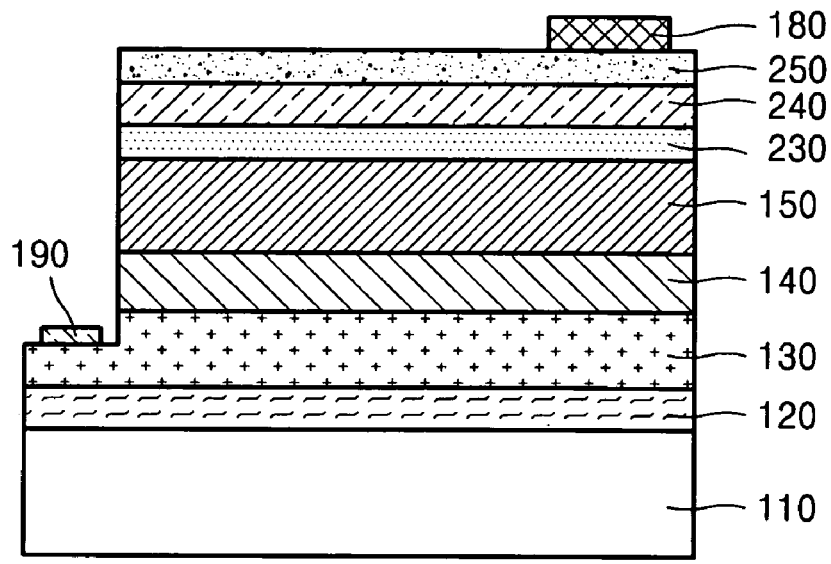
FIG. 5 is a cross-sectional view of a light emitting device with a p-electrode structure according to a fifth embodiment of the present invention.

FIG. 5 is a cross-sectional view of a light emitting device with a p-electrode structure according to a fifth embodiment of the present invention. Referring to FIG. 5, the light emitting device includes an ohmic contact layer 230, a reflective layer 240 and a capping layer 250 sequentially formed on the p-cladding layer 150. That is, the p-electrode structure includes the ohmic contact layer 230, the reflective layer 240, and the capping layer 250. In the flip-chip light emitting device design, the capping layer 250 is used to yield good adhesion to a p-electrode pad and suppress oxidation of the reflective layer 240 in order to improve durability. The capping layer 250 may be formed of at least one selected from the group consisting of Ni, Pt, Pd, Zn, and TiN to a thickness of 100 to 2,000 nm.

Figure 6:
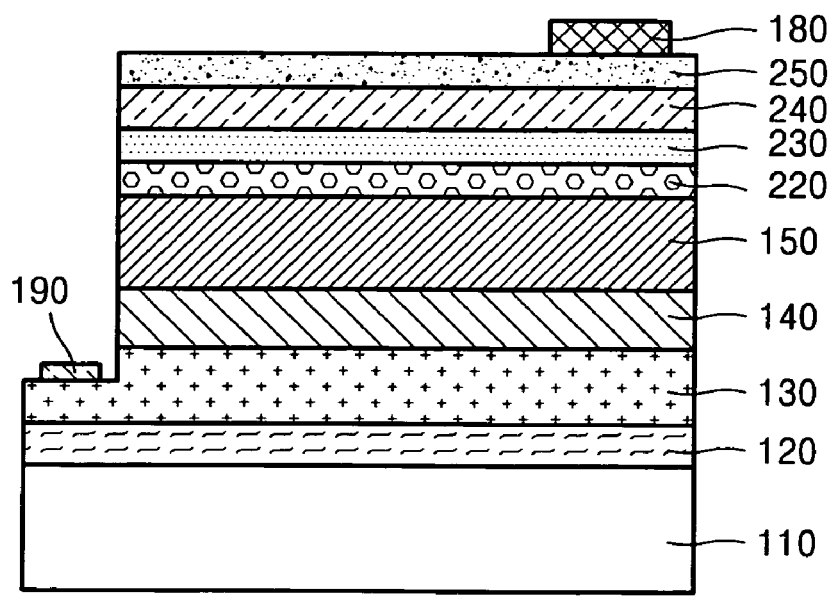
FIG. 6 is a cross-sectional view of a light emitting device with a p-electrode structure according to a sixth embodiment of the present invention.

FIG. 6 shows an example of a light emitting device including a capping layer 250 in addition to the light emitting device structure of FIG. 4. Referring to FIG. 6, the light emitting device includes an insertion layer 220, an ohmic contact layer 230, a reflective layer 240 and a capping layer 250 sequentially formed on the p-cladding layer 150. That is, the p-electrode structure includes the insertion layer 220, the ohmic contact layer 230, the reflective layer 240, and the capping layer 250.

Meanwhile, a method of each of the light emitting devices described with reference to FIGS. 2–6 includes depositing the p-electrode structure on a structure in which layers (up to the p-cladding layer 150) have been formed on the substrate 110 and annealing the resultant structure. The p-electrode structure subjected to annealing has improved current-voltage (I-V) characteristics over before annealing.

A nitride-based light emitting device using a p-type conductive transparent thin film electrode layer and a method of fabricating the same according to the present invention provide excellent I-V characteristics by improving characteristics of an ohmic contact to a p-cladding layer while enhancing light emission efficiency of the device due to high light transmittance exhibited by a transparent electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nitride-based light emitting device including an active layer between an n-cladding layer and a p-cladding layer, the device comprising an ohmic contact layer formed on the p-cladding layer using oxide containing a p-type dopant,
wherein the oxide is one of a first binary oxide comprising an element selected among elements in group 2A including Be, Mg, Ca, Sr, Ba, and Ra, a second binary oxide comprising an element selected from elements in group 2B including Zn, Cd, and Hg, a first ternary oxide comprising an element selected from the elements in group 2A and an element selected from the elements in group 2B, and a second ternary oxide comprising an element selected from elements in group 6B including S, Se, Te, and Po and one selected from the elements in group 2B, and
wherein the p-type dopant comprises at least one element selected from a first dopant group consisting of Li, Na, K, Rb, Cs, Cu, Ag, Au, V, Nb, Ta, N, P, As, Sb, and Bi.

2. The device of claim 1, wherein the oxide is a compound selected from the group consisting of BeO, CaO, SrO, BaO, MgO, CdO, ZnO, $Mg_{1-x}Zn_xO$, $Be_{1-x}Zn_xO$, $Zn_{1-x}Ba_xO$, $Zn_{1-x}Ca_xO$, $Zn_{1-x}Cd_xO$, $Zn_{1-x}Se_xO$, $Zn_{1-x}S_xO$, and $Zn_{1-x}Te_xO$.

3. The device of claim 1, wherein the ohmic contact layer is made of one of $Mg_{1-x}Zn_xO$ and $Be_{1-x}Zn_xO$, and the first dopant group further comprises As.

4. The device of claim 1, wherein the amount of the p-type dopant added to the oxide is in the range of 0.001 to 40 weight percent.

5. The device of claim 1, wherein the ohmic contact layer is formed to a thickness of 1 to 1,000 nm.

6. The device of claim 1, further comprising a substrate formed under the n-cladding layer using one of sapphire, SiC, Si, and GaAs.

7. The device of claim 1, further comprising a reflective layer formed on the ohmic contact layer using at least one element selected from the group consisting of Ag, Al, Zn, Mg, Ru, Ti, Rh, Cr, and Pt.

8. The device of claim 7, wherein the reflective layer is formed to a thickness of 100 to 2,000 nm.

9. The device of claim 7, further comprising a capping layer formed on the reflective layer using at least one selected from the group consisting of Ni, Pt, Pd, Zn, and TiN.

10. The device of claim 1, further comprising an insertion layer formed between the p-cladding layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

11. The device of claim 10, wherein the insertion layer is formed to a thickness of 1 to 5 nm.

12. A nitride-based light emitting device including an active layer between an n-cladding layer and a p-cladding layer, the device comprising an ohmic contact layer formed on the p-cladding layer using $In_2O_3$ containing a p-type dopant,
wherein the p-type dopant comprises at least one element selected from a dopant group consisting of Cu, Ag, Au, Zn, Cd, and Hg.

13. The device of claim 12, further comprising a reflective layer formed on the ohmic contact layer using at least one element selected from the group consisting of Ag, Al, Zn, Mg, Ru, Ti, Rh, Cr, and Pt.

14. The device of claim 13, wherein the reflective layer is formed to a thickness of 100 to 2,000 nm.

15. The device of claim 13, further comprising a capping layer formed on the reflective layer using at least one selected from the group consisting of Ni, Pt, Pd, Zn, and TiN.

16. The device of claim 12, further comprising an insertion layer formed between the p-cladding layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

17. The device of claim 16, wherein the insertion layer is formed to a thickness of 1 to 5 nm.

18. The device of claim 12, wherein the amount of the p-type dopant added to $In_2O_3$ is in the range of 0.001 to 40 weight percent.

19. A method of manufacturing a nitride-based light emitting device including an active layer between an n-cladding layer and a p-cladding layer, the method comprising:
forming an ohmic contact layer of an oxide containing a p-type dopant on the p-cladding layer in a structure on which the n-cladding layer, the active layer, and the p-cladding layer have been formed sequentially on a substrate; and
annealing the resultant structure obtained by the forming of the ohmic contact layer,
wherein the oxide is one of a first binary oxide comprising an element selected among elements in group 2A including Be, Mg, Ca, Sr, Ba, and Ra, a second binary oxide comprising an element selected from elements in group 2B including Zn, Cd, and Hg, a first ternary oxide comprising an element selected from the elements in group 2A and an element selected from the elements in group 2B, and a second ternary oxide comprising an element selected from elements in group 6B including S, Se, Te, and Po and one selected from the elements in group 2B, and
wherein the p-type dopant of the oxide forming the ohmic contact layer comprises at least one element selected from a first dopant group consisting of Li, Na, K, Rb, Cs, Cu, Ag, Au, V, Nb, Ta, N, P, As, Sb, and Bi.

20. The method of claim 19, wherein the active layer has one of InGaN/GaN multiquantum well (MQW) and AlGaN/GaN MQW structures.

21. The method of claim 19, wherein in the forming of the ohmic contact layer, the amount of the p-type dopant added to the oxide is in the range of 0.001 to 40 weight percent.

22. The method of claim 19, wherein the ohmic contact layer is formed to a thickness of 1 to 1,000 nm.

23. The method of claim 19, wherein the ohmic contact layer is deposited using one of one of electron-beam evaporator, sputtering deposition, and pulsed laser deposition.

24. The method of claim 23, wherein the ohmic contact layer is deposited at temperature of 20 to 1,500° C. under pressure within a reactor in an evaporator of atmospheric pressure to $10^{-12}$ Torr.

25. The method of claim 19, further comprising forming an insertion layer between the p-cladding layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

26. The method of claim 25, wherein the insertion layer is formed to a thickness of 1 to 5 nm.

27. The method of claim 19, further comprising forming a reflective layer on the ohmic contact layer using at least one element selected from the group consisting of Ag, Al, Zn, Mg, Ru, Ti, Rh, Cr, and Pt.

28. The method of claim 27, further comprising forming a capping layer on the reflective layer using at least one selected from the group consisting of Ni, Pt, Pd, Zn, and TiN.

29. The method of claim 28, wherein the reflective layer and the capping layer each are formed to a thickness of 100 to 2,000 nm.

30. The method of claim 29, wherein the annealing is performed at temperature of 100 to 800° C.

31. The method of claim 30, wherein the annealing is performed for 10 seconds to 3 hours.

32. The method of claim 19, wherein the annealing is performed in atmosphere of at least one gas selected from the group consisting of $N_2$, Ar, He, $O_2$, $H_2$, and air.

33. A method of manufacturing a nitride-based light emitting device including an active layer between an n-cladding layer and a p-cladding layer, the method comprising:

forming an ohmic contact layer of $In_2O_3$ containing a p-type dopant on the p-cladding layer in a structure on which the n-cladding layer, the active layer, and the p-cladding layer have been formed sequentially on a substrate; and annealing the resultant structure obtained by the forming of the ohmic contact layer, wherein the p-type dopant of the $In_2O_3$ comprises at least one element selected from a dopant group consisting of Cu, Ag, Au, Zn, Cd, and Hg.

* * * * *

UNITED STATES PATENT AND TRADEMARK OFFICE
CERTIFICATE OF CORRECTION

PATENT NO. : 7,193,249 B2  Page 1 of 1
APPLICATION NO. : 10/963725
DATED : March 20, 2007
INVENTOR(S) : Tae-yeon Seong et al.

It is certified that error appears in the above-identified patent and that said Letters Patent is hereby corrected as shown below:

Title page, item (73), please add the following:

--(73) Assignee:

Gwangju Institute of Science and Technology
    Buk-gu, Gwangju-si, Republic of Korea--

Signed and Sealed this

Twenty-third Day of December, 2008

JON W. DUDAS
*Director of the United States Patent and Trademark Office*